(12) United States Patent
Xiao et al.

(10) Patent No.: US 9,825,382 B2
(45) Date of Patent: Nov. 21, 2017

(54) LOW PROFILE CONNECTOR AND ASSEMBLY OF THE SAME

(71) Applicant: FOXCONN INTERCONNECT TECHNOLOGY LIMITED, Grand Cayman (KY)

(72) Inventors: Xue-Yuan Xiao, Kunshan (CN); Zi-Qiang Zhu, Kunshan (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/140,428

(22) Filed: Apr. 27, 2016

(65) Prior Publication Data

US 2016/0315403 A1 Oct. 27, 2016

(30) Foreign Application Priority Data

Apr. 27, 2015 (CN) ..................... 2015 2 0256789 U

(51) Int. Cl.
*H05K 1/00* (2006.01)
*H01R 13/41* (2006.01)
(Continued)

(52) U.S. Cl.
CPC ........... *H01R 12/707* (2013.01); *H01R 12/57* (2013.01); *H01R 12/72* (2013.01);
(Continued)

(58) Field of Classification Search
CPC .............. H01R 13/6581; H01R 12/716; H01R 12/7082; H01R 12/113; H01R 12/707; H01R 43/0256
(Continued)

(56) References Cited

U.S. PATENT DOCUMENTS 5,197,891 A * 3/1993 Tanigawa ............. H01R 12/716
439/83
5,615,944 A * 4/1997 Siegfried ................. B60Q 3/51
313/318.02

(Continued)

FOREIGN PATENT DOCUMENTS

TW 452258 6/2000

*Primary Examiner* — Amy Cohen Johnson
*Assistant Examiner* — Milagros Jeancharles
(74) *Attorney, Agent, or Firm* — Wei Te Chung; Ming Chieh Chang

(57) ABSTRACT

A connector (100) and assembly of the same, the connector comprises an insulative housing (1) and a plurality of contacts (2) assembled onto the insulative housing (1), the insulative housing (1) defining a mating surface (11) and a mounting surface (12) opposite to the mating surface (11). Each contact (2) including a contact portion (21) arranged in the insulative housing (1) and a mounting portion (22) locating at the mounting surface (12) and protruding sidewardly beyond said insulative housing, the mounting portion (22) defines a soldering surface (222) for being soldered onto to said printed circuit board (200), said soldering surface (222) face toward the mounting surface (12). Therefore, when the connector (100) assembled to the printed circuit board (200), we could make full use of the height space at the up and down direction of the printed circuit board (200), thus greatly reducing the height space occupied by the connector (100).

13 Claims, 14 Drawing Sheets

(51) Int. Cl.
   *H01R 13/428* (2006.01)
   *H01R 12/70* (2011.01)
   *H01R 43/02* (2006.01)
   *H01R 12/57* (2011.01)
   *H01R 12/72* (2011.01)
   *H05K 1/18* (2006.01)

(52) U.S. Cl.
   CPC ......... *H01R 43/0256* (2013.01); *H05K 1/182* (2013.01); *H01R 13/41* (2013.01)

(58) Field of Classification Search
   USPC ............ 439/76.1, 607.36, 82, 83, 668, 669, 439/607.09
   See application file for complete search history.

(56) References Cited

U.S. PATENT DOCUMENTS

| | | | |
|---|---|---|---|
| 5,919,051 A * | 7/1999 | Mitra | H01R 12/716 439/74 |
| 6,287,130 B1 * | 9/2001 | Torii | H01R 12/707 439/83 |
| 6,364,706 B1 * | 4/2002 | Ando | H01R 23/6873 439/607.37 |
| 6,382,989 B1 * | 5/2002 | Yu | H01R 13/4361 439/686 |
| 6,551,143 B2 * | 4/2003 | Tanaka | H01R 12/7088 439/224 |
| 6,652,303 B2 * | 11/2003 | Stockel | H01R 25/164 439/107 |
| 7,074,054 B2 * | 7/2006 | Mertz | H01R 13/74 439/78 |
| 7,140,895 B2 * | 11/2006 | Tuin | H01R 12/57 439/246 |
| 7,150,652 B1 * | 12/2006 | Jeon | H01R 13/6658 439/607.13 |
| 7,357,651 B2 * | 4/2008 | Minoura | H01R 13/111 439/82 |
| 7,556,515 B2 * | 7/2009 | Kato | H01R 33/02 439/171 |
| 7,581,965 B1 * | 9/2009 | Upasani | H05K 3/32 439/82 |
| 7,704,082 B2 * | 4/2010 | Daily | H01R 12/57 439/83 |
| 7,828,578 B1 * | 11/2010 | Ju | H01R 13/112 439/342 |
| 7,850,466 B2 * | 12/2010 | Mostoller | H01R 12/57 439/83 |
| 8,100,703 B2 * | 1/2012 | Chen | H01R 12/716 439/83 |
| 8,113,859 B2 * | 2/2012 | Kim | H01R 13/111 439/239 |
| 8,277,240 B2 * | 10/2012 | Urano | H01R 12/57 439/232 |
| 8,317,529 B2 * | 11/2012 | Katano | H01R 13/115 439/251 |
| 8,430,682 B2 * | 4/2013 | Liao | H01R 12/57 439/342 |
| 8,435,077 B2 * | 5/2013 | Yang | H01R 12/721 439/637 |
| 8,727,809 B2 * | 5/2014 | Mongold | H01R 12/721 439/607.14 |
| 8,764,470 B2 * | 7/2014 | Little | H01R 12/716 439/284 |
| 8,821,191 B2 * | 9/2014 | Soo | H01R 12/55 439/630 |
| 9,136,641 B2 * | 9/2015 | Bishop | H01R 4/4836 |
| 9,157,930 B2 * | 10/2015 | Nickel | G01R 1/06772 |
| 9,450,313 B2 * | 9/2016 | Tsai | H01R 4/027 |
| 9,466,893 B2 * | 10/2016 | Bishop | H01R 4/4836 |
| 2009/0046462 A1 * | 2/2009 | Park | G02F 1/133604 362/249.01 |
| 2010/0173540 A1 * | 7/2010 | Lee | F21V 19/0085 439/861 |
| 2011/0059634 A1 * | 3/2011 | Chen | H01R 12/716 439/83 |
| 2011/0076862 A1 * | 3/2011 | Yeh | H01R 13/2457 439/70 |
| 2013/0210247 A1 * | 8/2013 | Wang | H01R 12/57 439/83 |
| 2016/0079696 A1 * | 3/2016 | Krishnamoorthy | H01R 13/20 439/81 |

* cited by examiner

US 9,825,382 B2

LOW PROFILE CONNECTOR AND ASSEMBLY OF THE SAME

BACKGROUND OF THE INVENTION

1. Field of the Invention

The present invention relates to a connector and assembly of the same, particularly to a low profile connector and assembly of the same. This application relates to the copending application filed on the same date, having the same inventors, the same assignee and the same applicant, and titled with "CONNECTOR AND ASSEMBLY OF THE SAME".

2. Description of Related Art

A connector disclosed in Taiwan Patent No. TW 452258, issued on Aug. 21, 2001, is a related connector. The connector can be assembled on printed circuit board, which comprises a insulative housing and a plurality of contacts received in the insulative housing, the insulative housing defining a mating surface mating with mating member and a mounting surface opposite to the mating surface, the contact including a mounting portion arranged on the mounting surface of the insulative housing, both the mounting portion and the mounting surface of the insulative housing arranged on the up surface of the printed circuit board. Said connector assembled on the circuit board will not only lead to the height occupied by connector assembly greatly increased, but also the surface area occupied by the mounting surface of the insulative housing and the mounting portion of the terminal extending out of the mounting surface increased, and leading the printed circuit board can not to arrange more electronic components within the limited space, it is not beneficial to the miniaturization of the electronic module.

Hence, a new and simple connector and assembly of the same is desired.

SUMMARY OF THE INVENTION

According to one aspect of the present invention, a connector and assembly of the same, the connector comprises an insulative housing and a plurality of contacts assembled onto the insulative housing, the insulative housing defining a mating surface and a mounting surface opposite to the mating surface. Each contact including a contact portion arranged in the insulative housing and a mounting portion locating at the mounting surface and protruding sidewardly beyond said insulative housing, the mounting portion defines a soldering surface for being soldered onto to said printed circuit board, said soldering surface face toward the mounting surface. Therefore, when the connector assembled to the printed circuit board, we could make full use of the height space at the up and down direction of the printed circuit board, thus greatly reducing the height space occupied by the connector.

The foregoing has outlined rather broadly the features and technical advantages of the present invention in order that the detailed description of the invention that follows may be better understood. Additional features and advantages of the invention will be described hereinafter which form the subject of the claims of the invention.

DETAILED DESCRIPTION OF THE PREFERRED EMBODIMENT

Reference will now be made in detail to the preferred embodiment of the present invention.

Figure 1:
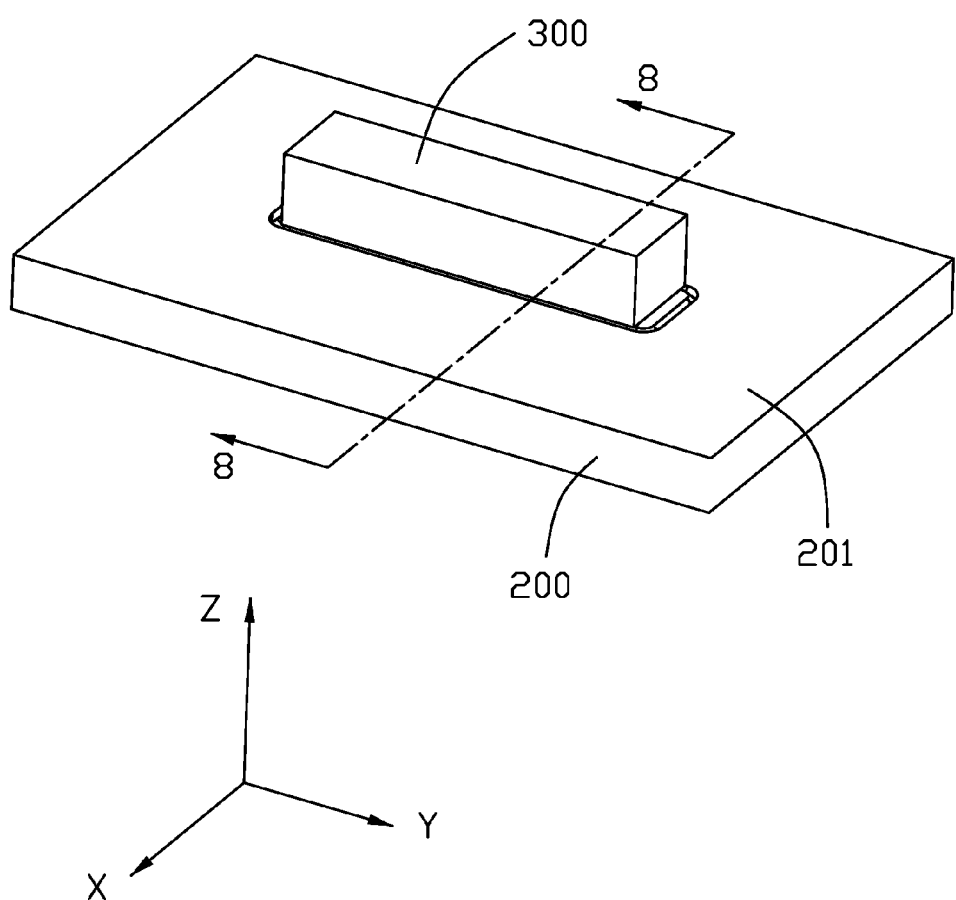
FIG. 1 is a perspective view of the cooperating between connector assembly and stepper motor of the first embodiment.
Figure 2:
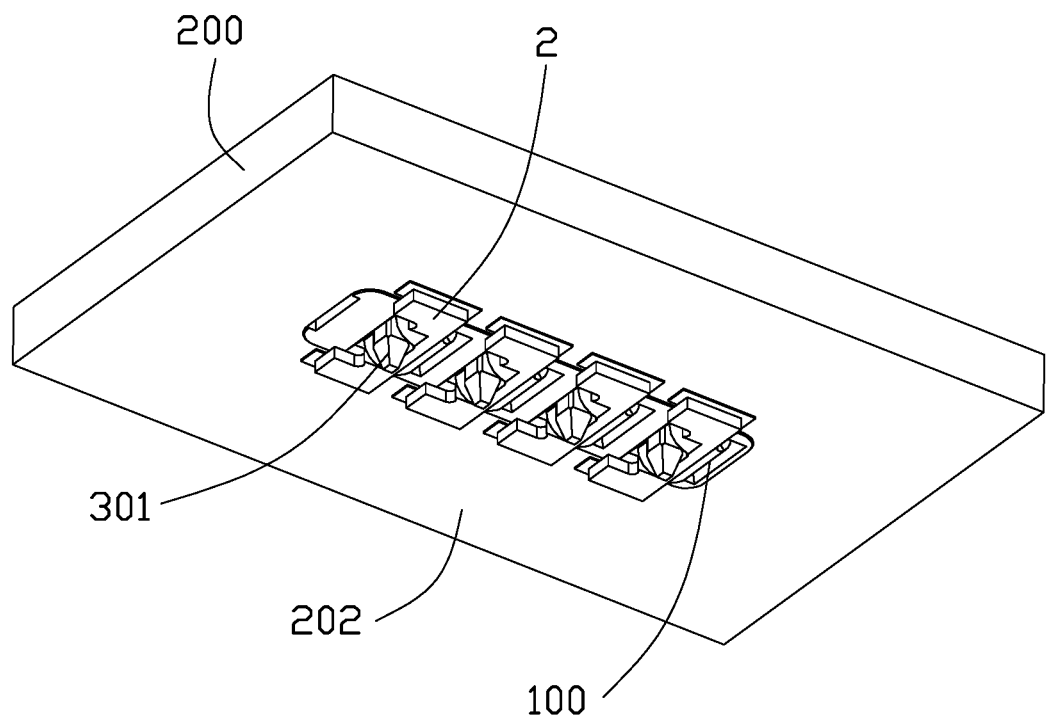
FIG. 2 is another perspective view of FIG. 1.
Figure 3:
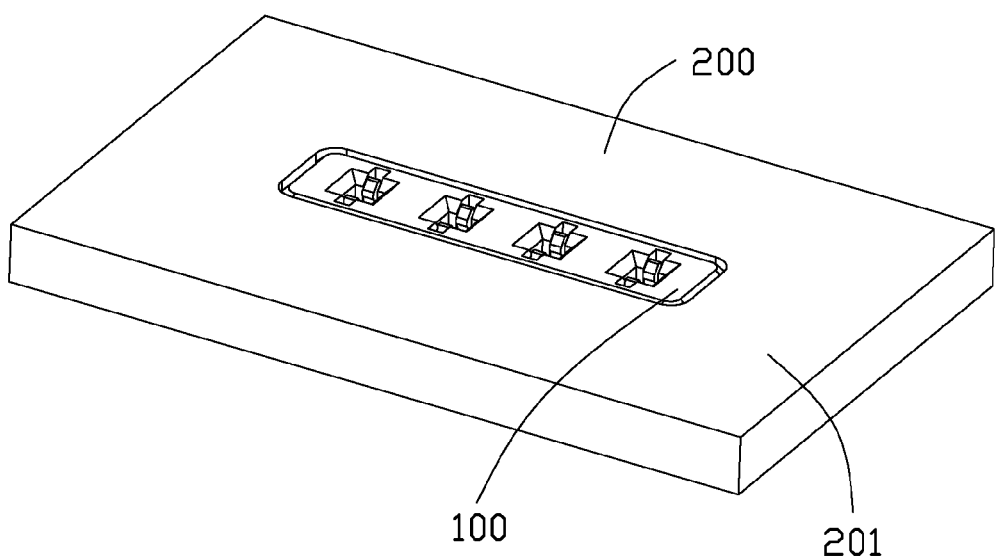
FIG. 3 is a perspective view of the connector assembly of FIG. 1.
Figure 4:
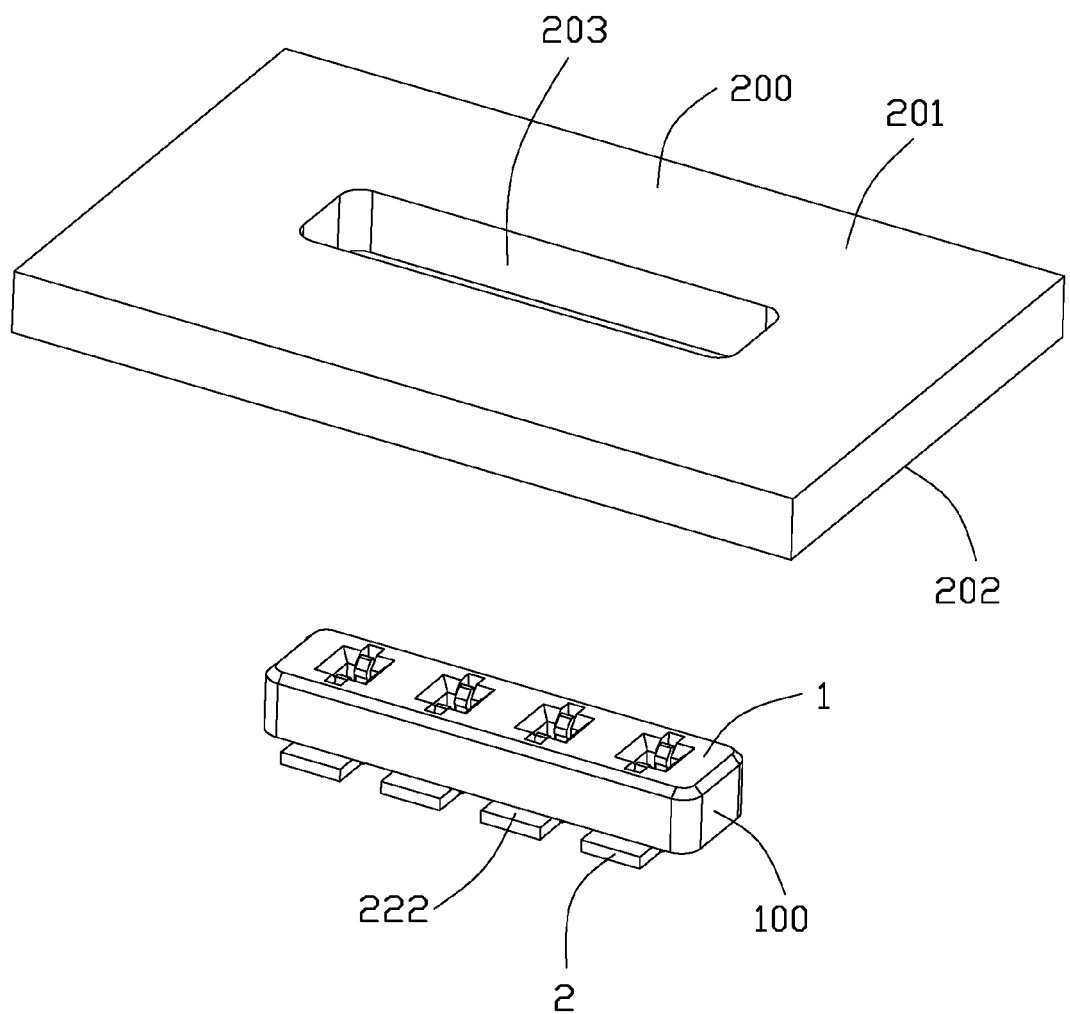
FIG. 4 is a perspective view of the separation after the connector and the printed circuit board of FIG. 3.
Figure 5:
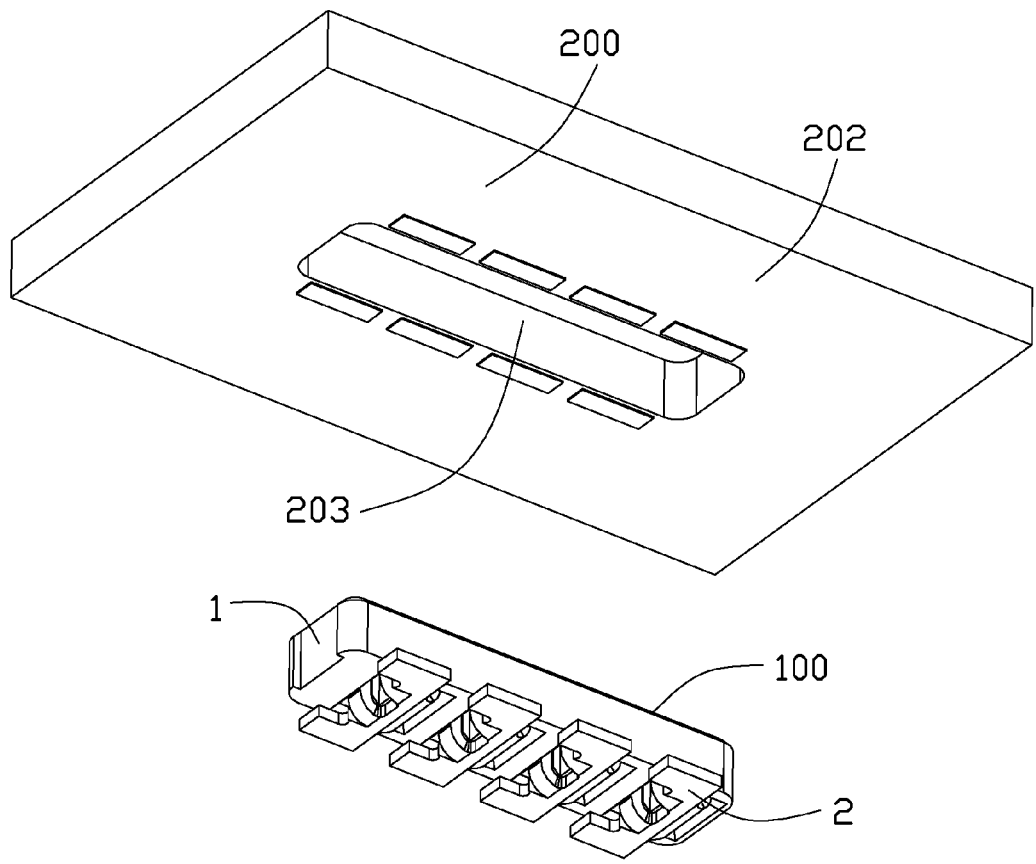
FIG. 5 is another perspective view of FIG. 4.
Figure 6:
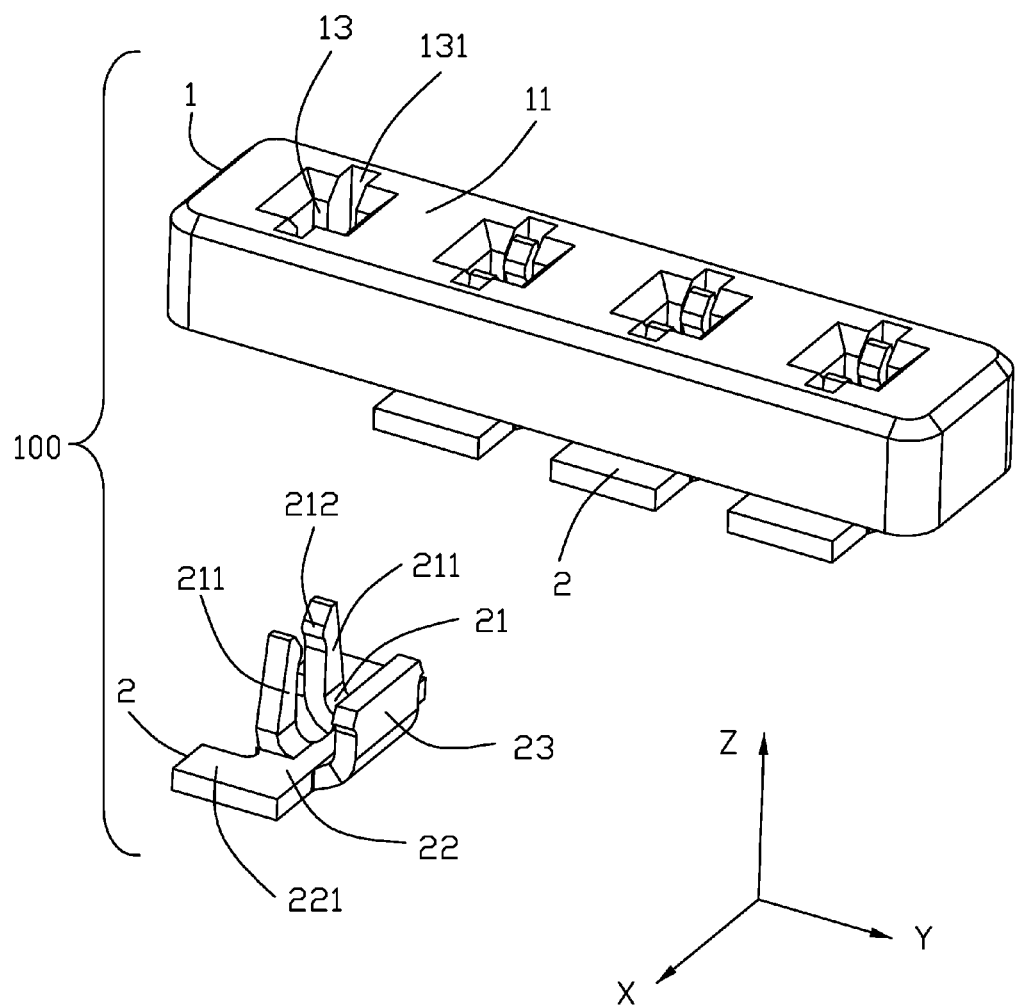
FIG. 6 is a partial exploded, perspective view of the connector of FIG. 4.
Figure 7:
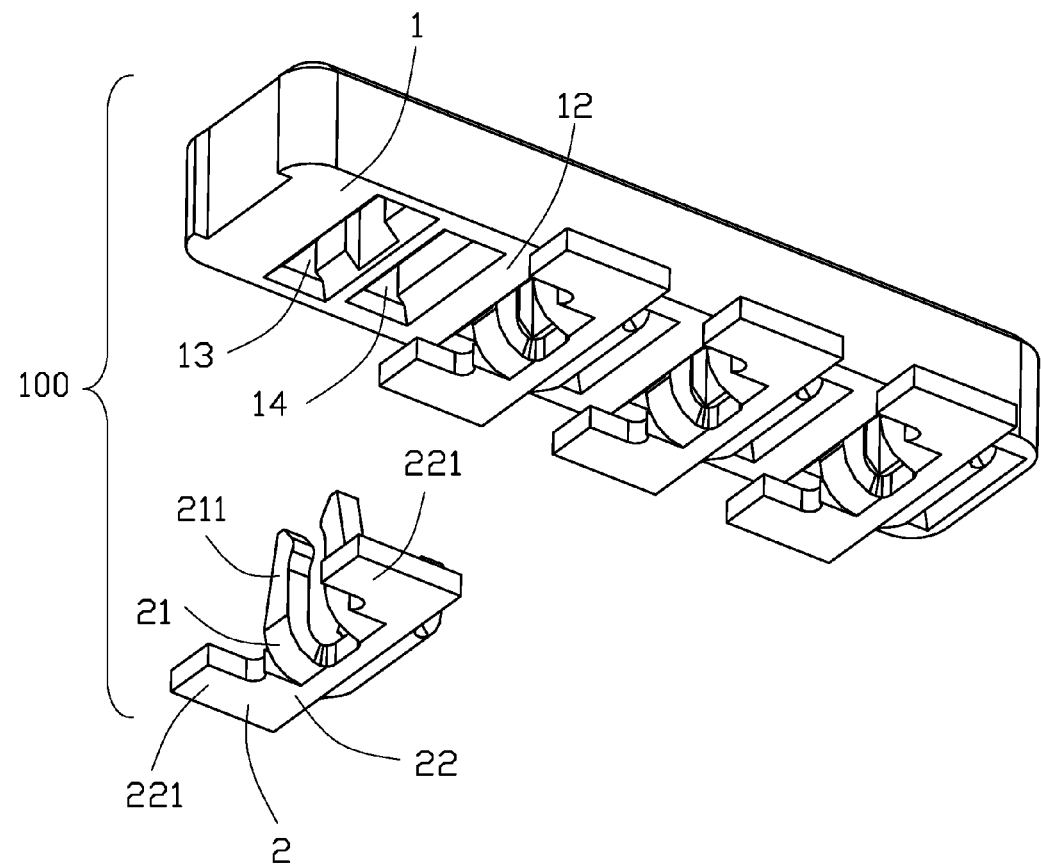
FIG. 7 is another perspective view of FIG. 6.
Figure 8:
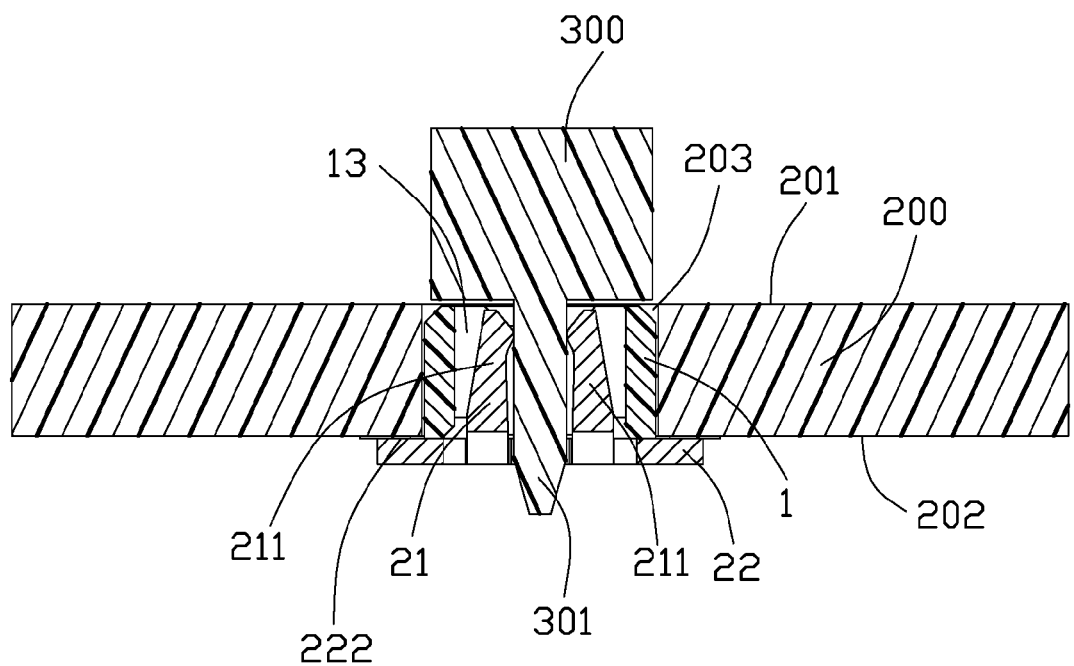
FIG. 8 is a cross sectional view shown in FIG. 1 along line 8-8.
Figure 13:
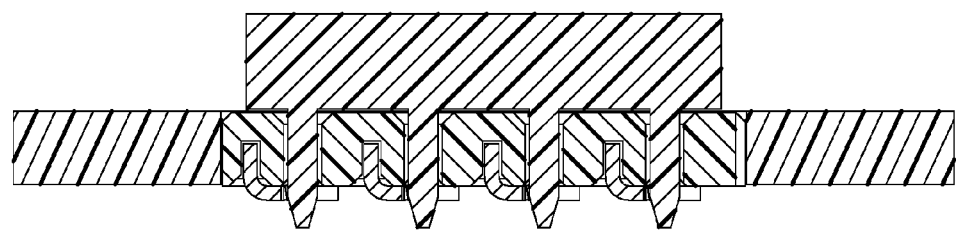
FIG. 13 is a cross sectional view after the stepper motor inserting the connector assembly of the first embodiment.

Referring to FIGS. 1-8 and 13, the first embodiment of the instant invention discloses a connector assembly for stepper motor 300 directly inserting of auto use, the connector assembly comprising a printed circuit board 200 and a connector 100 assembled to the printed circuit board 200. The connector assembly defines a transverse direction along the X axis, a longitudinal direction along the Y axis and a vertical direction along the Z axis.

The printed circuit board 200 includes a first surface 201, a second surface 202 opposite to said first surface 201 and an opening 203 penetrating said first surface 201 and second surface 202. In present embodiment, the first surface 201 and the second surface 202 are the upper surface and the lower surface of the printed circuit board 200, the opening 203 is closed and located in the middle position of the printed circuit board 200; in other embodiment, the first and the second surfaces 201,202 can also be the lower surface and an upper surface of the printed circuit board 200, and the opening 203 can also be open and located at the edge of the printed circuit board 200.

The connector 100 is assembled to an opening 203 of said printed circuit board 200 and comprises an insulative housing 1 received in the opening 203 and a plurality of contacts 2 assembled onto the insulative housing 1.

The insulative housing 1 extends along the longitudinal direction and defines a mating surface 11 exposed to the up side of the printed circuit board 200, a mounting surface 12 exposed to the down side of the printed circuit board 200 opposite to the mating surface 11 and a plurality of contact grooves 13 passing though the mating surface 11 and the mounting surface 12 to enclose the inserting portion 301 of the stepper motor 300. The contact grooves 13 arranged along the longitudinal direction of the insulative housing 1, and each contact groove 13 defines a positioning groove 131 along two sides of transverse perpendicular to the longitudinal direction. The insulative housing 1 also comprises a locking groove 14 which is interval arranged with the contact grooves 13, and the locking groove 14 is recessed upwardly form the mounting surface 12 of the insulative housing 1 and not upwardly passed though the mating surface 11.

The contact 2 is assembled upwardly to the insulative housing 1 from the mounting surface 12 of the insulative housing 1, and comprises a contact portion 21 arranged in the insulative housing 1 and a mounting portion 22 locating at the mounting surface 12. Each contact portion 21 includes a pair of forked clamping portions 211 received in respective contact grooves 13, the clamping portion 211 enclosed in the positioning groove 131 for fear that the stepper motor 300 swings along the longitudinal direction when the stepper motor 300 mated with said clamping portion 211 inserted in the contact grooves 13, the clamping portion 211 arranged along transverse interval to locking the inserting portion 301 of the stepper motor 300 to insert in the contact grooves 13, the clamping portion 211 defining tabs 212 to interfere with the insertion portion 301 so as to enhance the clamping force of the clamping portion 211. Each mounting portion 22 includes a pair of mounting tails 221 horizontally extending from respective opposite sides of the two opposite clamping portions 211, said mounting tail 221 leaning against the mounting surface 12 of the insulative housing 1 and protruding sidewardly beyond the mounting surface 12 from two sides, said mounting tail 221 protruding sidewardly beyond the mounting surface 202 and assembled to the second surface 202 of the printed circuit board 200 by the means of Surface Mount Technology (SMT). The upper surface of said mounting portion 22 forms a soldering surface 222 to solder to the second surface 202 of the printed circuit board 200. The contact 2 also comprises a connecting portion 23 integrally connecting two clamping portions 211, the time when the contact 2 assembled to the insulative housing 1, the connecting portion 23 inserting in the locking groove 14 from downside to upside so as to fix the contact 2 to the insulative housing 1.

The present invention with the soldering surface 222 of the mounting portion 22 of the contact 2 face toward the mating surface 11 of the insulative housing 1, therefore, when the connector 100 assembled to the printed circuit board 200, we could make full use of the height space at the up and down direction of the printed circuit board 200, and greatly reducing the height space occupied by the connector 100; at the same time, with the soldering surface 222 of the mounting portion 22 assembled to the second surface 202 of the printed circuit board 200, avoiding the area of first surface 201 occupied simultaneously by the mounting surface 11 of the insulative housing 1 and the mounting portion 22 for saving more space to arrange more electronic components on the printed circuit board 200, which is beneficial to miniaturization of the electronic module.

Besides, the present invention with the mating surface 11 of the insulative housing 1 aligns to a first surface 201 of the printed circuit board 200 or located at the downside of the first surface 201 of the printed circuit board 200, the mounting surface 12 of the insulative housing 1 aligns to a second surface 202 of the printed circuit board 200 opposite to the first surface 201 or locates at the upside of second surface 202 of the printed circuit board 200, thereby making the connector 100 fully embedded in the openings 203 of the printed circuit board 200 without taking up space height, which is contributing to thin of the electronic module.

Figure 9:
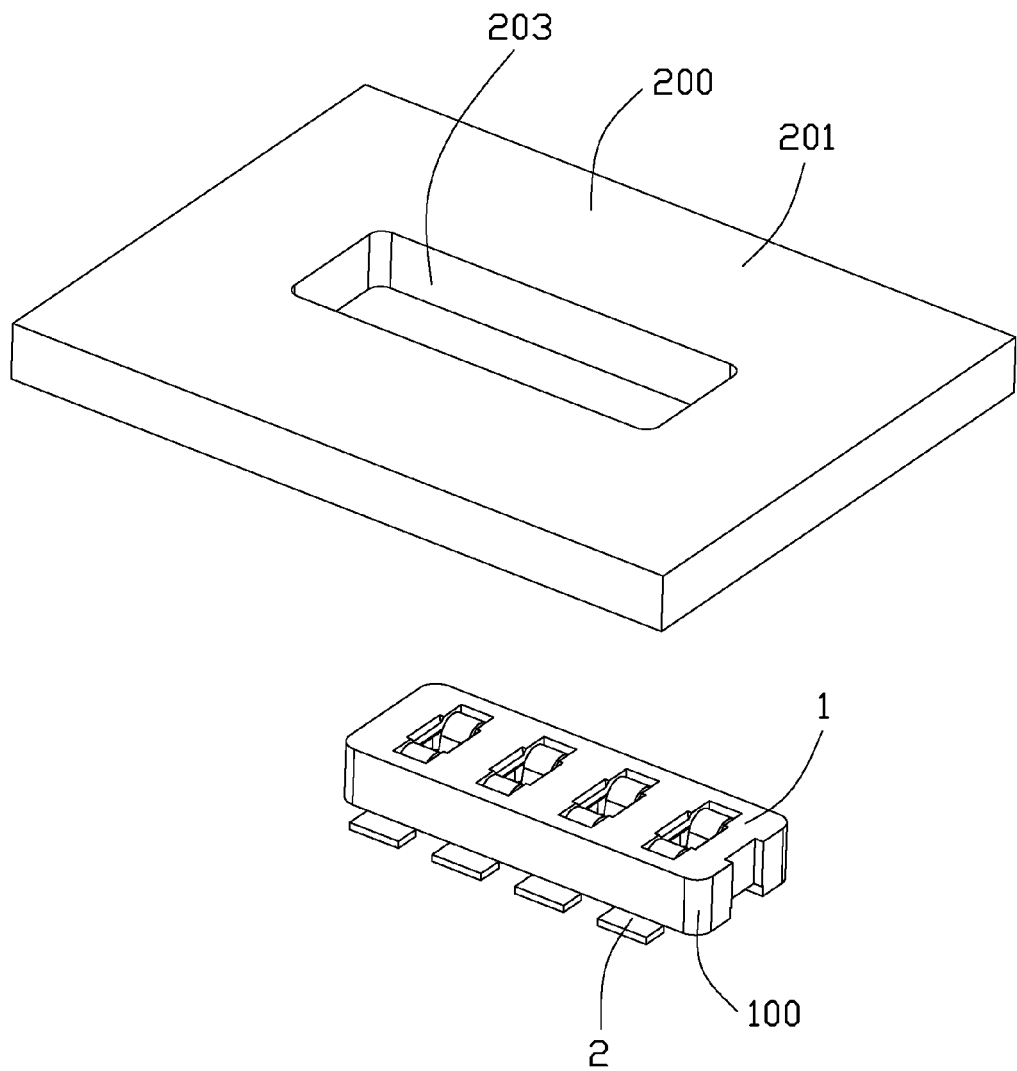
FIG. 9 is a perspective view of the separation after the connector and the printed circuit board of the second embodiment.
Figure 10:
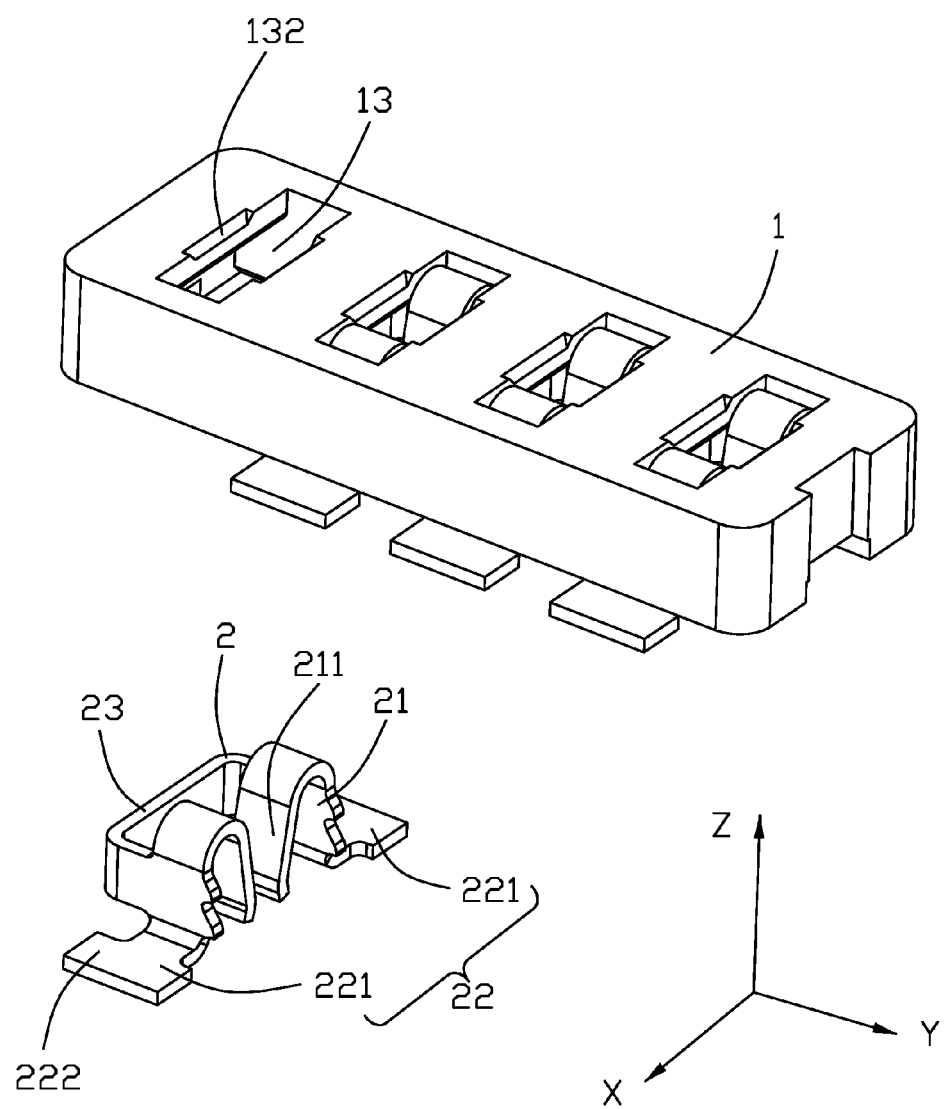
FIG. 10 is a partial exploded, perspective view of FIG. 9.
Figure 11:
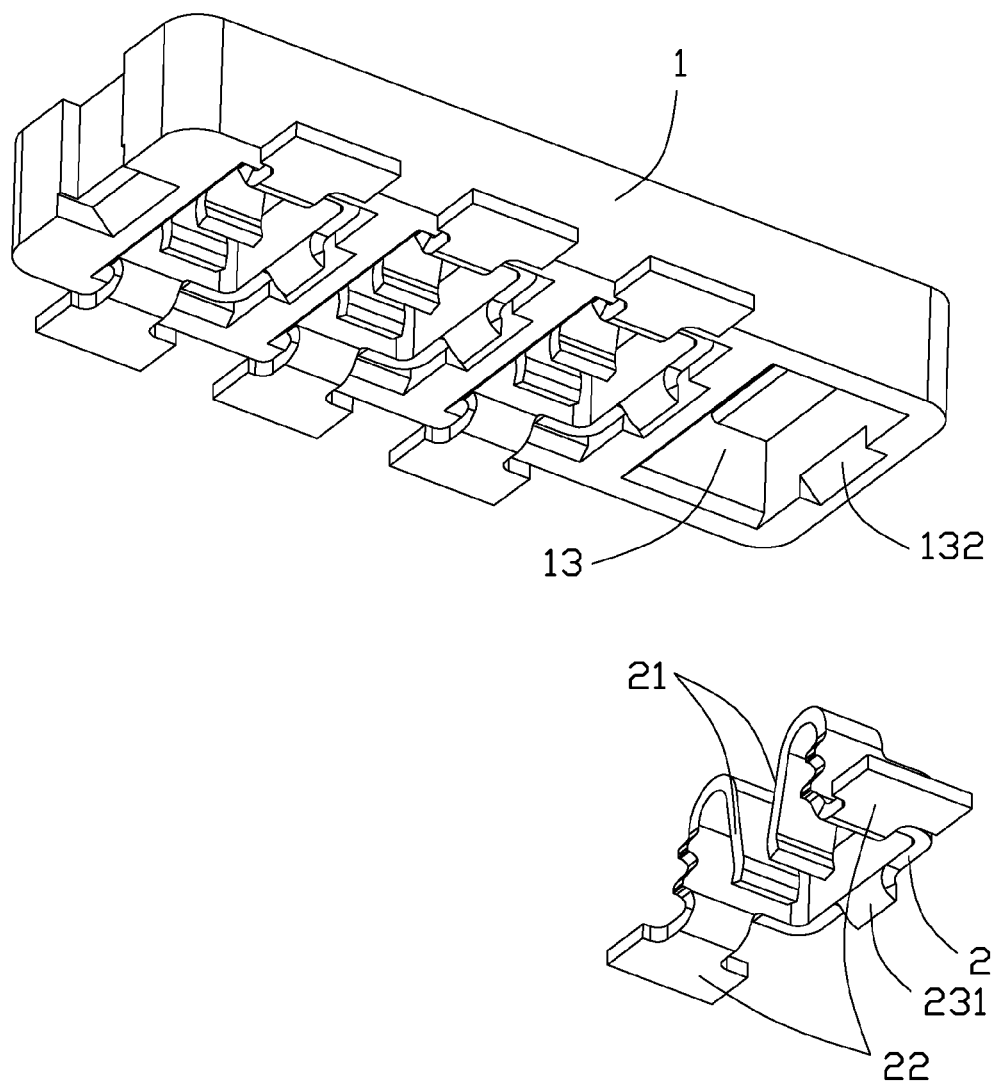
FIG. 11 is another perspective view of FIG. 10.
Figure 12:
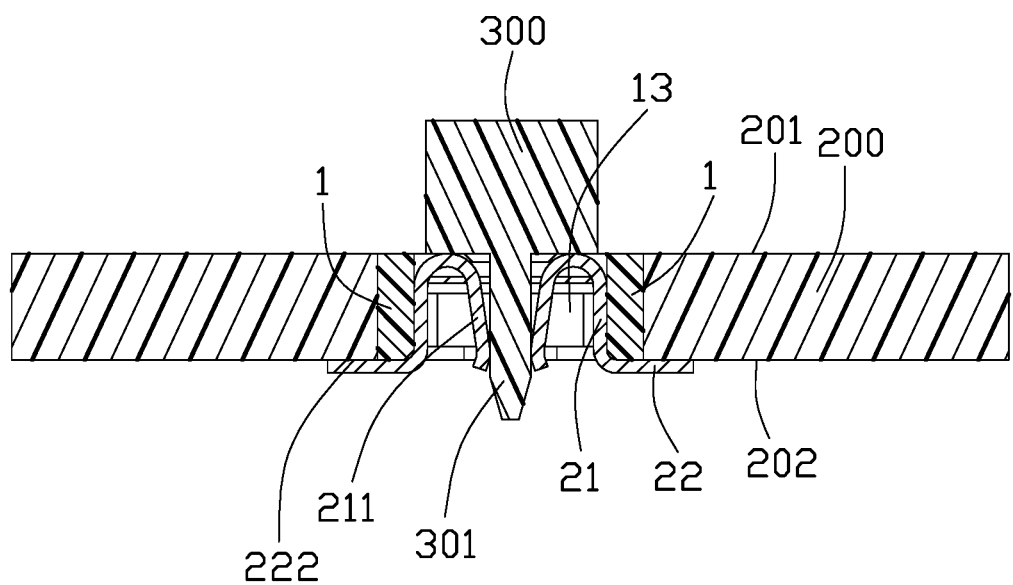
FIG. 12 is a cross sectional view after the stepper motor inserting the connector assembly of the second embodiment.
Figure 14:
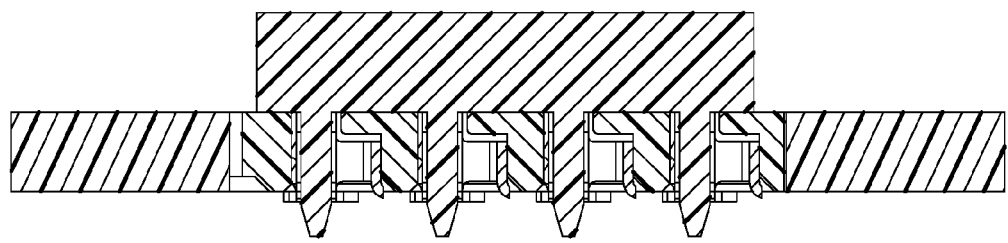
FIG. 14 is a cross sectional view after the stepper motor inserting the connector assembly of the second embodiment.

Referring to FIGS. 9-12 and 14, the second embodiment of the instant invention discloses a connector assembly, what the slightly different with the first embodiment is the structure of the insulative housing 1 and contact 2, so applicant will only detail address the difference of the insulative housing 1 and contact 2. In the second embodiment, each contact portion 21 includes a pair of forked clamping portions 211 received in the respective contact groove 13, the clamping portions 211 arranged along transverse in the first embodiment, but the clamping portions 211 arranged along longitudinal direction in the second embodiment, at the same time said two clamping portions 211 arranged along transverse interval. Two mounting tail 221 horizontally extend from up side of two clamping portions 211, said mounting tail 221 protruding out of the mounting surface 12 from two sides and assembled to the second surface 202 of the printed circuit board 200 by the means of Surface Mount Technology (SMT). The connecting portion 23 of the contact 2 also integrally connects two clamping portion 211, but the connecting portion 23 arranged to a U-shape and fixed in the contact grooves 13 of the insulative housing 1, the insulative housing 1 defining a slot 132 at one end of the contact grooves 13, under the connecting portion 23 defining a retainer 231 lock in the slot 131 for better fixing the contact 2 to the insulative housing 1.

Understandably, the instant invention is to provide the low profile connector essentially being fully received within the opening of the printed circuit board except the mounting portions of the contacts wherein in each contact the pair of clamping portions is located in a transverse plane and spaced from the corresponding connecting portion in the longitudinal direction. The connecting portion is located between the pair of mounting portions in the transverse direction. Each clamping portion forms a U-shaped configuration with an inner arm and an outer arm linked by a bight. While a preferred embodiment of the present invention has been shown and described, equivalent modifications and changes known to persons skilled in the art according to the spirit of the present invention are considered within the scope of the present invention as described in the appended claims.

What is claimed is:
1. A connector for being mounted onto a printed circuit board comprising:
an insulative housing defining a mating surface and a mounting surface opposite to the mating surface;
a plurality of contacts each including a contact portion arranged in the insulative housing, a mounting portion located at the mounting surface and protruding sidewardly beyond said insulative housing and a connecting portion;
wherein the insulative housing defines a set of contact grooves passing through the mating surface and the mounting surface for respectively receiving said contacts, each contact portion includes a pair of clamping portions received in the respective contact groove, each mounting portion includes a pair of mounting tails extending horizontally from the respective clamping portions and respectively disposed at the out side of the two clamping portions, each mounting tail defines a soldering surface for being soldered onto said printed circuit board, said soldering surface face toward the mounting surface and face to a same direction with the mating surface, both the pair of clamping portions and the pair of mounting tails integrally connect to the connecting portion,
wherein the insulative housing also comprises a plurality of locking grooves which are intervally arranged with the contact grooves to fix the connecting portion, and the locking groove is recessed upwardly from the mounting surface of the insulative housing for the connecting portion of the contact inserting upwardly.

2. The connector as claimed in claim 1, wherein the connector is assembled in an opening of said printed circuit board, the mating surface of the insulative housing aligns to a first surface of the printed circuit board or locates at an inner side of said first surface of the printed circuit board.

3. The connector as claimed in claim 2, wherein the mounting surface of the insulative housing aligns to a second surface of the printed circuit board opposite to the first surface or locates at an inner side of said second surface of the printed circuit board.

4. The connector as claimed in claim 1, wherein said mounting tail leans against the mounting surface of the insulative housing and protrudes sidewardly beyond the mounting surface.

5. An electrical connector assembly comprising:
a printed circuit board defining opposite first and second surfaces in a vertical direction;
an opening extending through the printed circuit board in the vertical direction;
an electrical connector including:
an insulative housing received within the opening and defining opposite first and second faces wherein the first face is flush with the first surface and the second face is flush with the second surface;
a plurality of contact grooves formed within the housing;
a plurality of contacts assembled into the corresponding contact grooves in a vertical direction from the second face to the first face, respectively;
each of said contacts defining a pair of mounting portions extending outwardly and oppositely out of the housing in a transverse direction perpendicular to the vertical direction and respectively soldered upon corresponding pads on the second surface, a pair of clamping portions adapted for mating with a mating element and located between said pair of mounting portions in said transverse direction and connected to the corresponding mounting portions, respectively, a connecting portion located between the pair of mounting portions in the transverse direction and spaced from the pair of clamping portions in the longitudinal direction perpendicular to both said vertical direction and said transverse direction, and extending in a vertical plane defined by the transverse direction and said vertical direction; wherein
said connecting portion is communicatively exposed to the second face while being protectively hidden behind the first face in the vertical direction; wherein
said housing further includes a plurality of locking grooves beside the corresponding contact grooves, respectively.

6. The electrical connector assembly as claimed in claim 5, wherein each of said clamping portions defines a U-shaped structure including an inner arm for mating with said mating element, an outer arm retaining the contact to the housing, and both the corresponding mounting portion and the connecting portion unitarily extend from the outer arm.

7. The electrical connector assembly as claimed in claim 5, wherein the pair of clamping portions are flexibly spaced from each other in the transverse direction.

8. The electrical connector assembly as claimed in claim 5, wherein each of the clamping portions is bent to a vertical position with a bending line extending along the transverse direction.

9. The electrical connector assembly as claimed in claim 5, wherein in each contact, said connecting portion cooperates with the corresponding pair of clamping portions to constitute another U-shaped configuration viewed in the transverse direction.

10. The electrical connector assembly as claimed in claim 5, wherein the whole housing is received within the opening.

11. The electrical connector assembly as claimed in claim 5, wherein during mating, said mating element has portions extending from the first surface through the housing and beyond the second surface.

12. The electrical connector assembly as claimed in claim 5, wherein each of said locking grooves is located beside the corresponding contact groove in the longitudinal direction.

13. The electrical connector assembly as claimed in claim 5, wherein the locking groove is exposed to the second face while being terminated before reaching the first face in the vertical direction.

* * * * *